United States Patent [19]
Paige

[11] 3,975,697
[45] Aug. 17, 1976

[54] SURFACE ACOUSTIC WAVE DEVICES

[75] Inventor: Edward George Sydney Paige, West Malvern, England

[73] Assignee: British Secretary of State for Defence, London, England

[22] Filed: Aug. 1, 1975

[21] Appl. No.: 601,687

[30] Foreign Application Priority Data
Aug. 16, 1974 United Kingdom............... 36289/74

[52] U.S. Cl. ............................ 333/30 R; 310/8.1; 310/9.8; 333/72
[51] Int. Cl.² .................... H03H 9/26; H03H 9/30; H03H 9/32; H01L 41/18
[58] Field of Search............. 333/30 R, 72; 310/9.8, 310/8.0, 8.1, 8.2, 8.3

[56] References Cited
UNITED STATES PATENTS
| | | | |
|---|---|---|---|
| 3,882,429 | 5/1975 | Martin | 333/30 R |
| 3,883,831 | 5/1975 | Williamson et al. | 333/72 X |
| 3,893,047 | 7/1975 | Lardat | 333/30 R |

Primary Examiner—Alfred E. Smith
Assistant Examiner—Marvin Nussbaum
Attorney, Agent, or Firm—Elliott I. Pollock

[57] ABSTRACT

A surface acoustic wave device comprises a substrate able to support surface acoustic waves, an input transducer for launching surface acoustic waves along a first track on the substrate, an output transducer for receiving surface acoustic waves from a second track on the substrate, and first and second reflective array structures arranged to reflect surface acoustic waves from the first track into the second track, the first and second reflective array structures each comprising numerous reflecting strips or grooves arranged parallel to one another in echalon across the first and second tracks respectively. Varying the lengths of the reflecting elements provides weighting of signals passing through the device, and varying the spacing between the reflecting elements provides pulse compression or expansion with a frequency sweep.

15 Claims, 5 Drawing Figures

SURFACE ACOUSTIC WAVE DEVICES

This invention relates to surface acoustic wave devices. Such devices may comprise a substrate carrying input and output transducers. Electrical signals are converted by the input transducer into surface acoustic waves (SAW) in the substrate from whence the SAW are received and reconverted into electric signals by the output transducer.

Various devices can be made using SAW device, for example oscillators, filters, pulse expanders, pulse compressors, etc. In some of the SAW devices the transducers, which are usually of interdigital finger or comb like form, are shaped by varying finger lengths within a transducer and/or spacings between fingers; this produces amplitude and phase response to provide the desired frequency behaviour. Unfortunately modifying transducers involves a compromise between the two functions of transducing electric signals to acoustic signals (and vice versa) and filtering (to provide the frequency response). One way of separating these two functions is to interpose a structure on the substrate between the input and output transducers; the structure performs the desired operation on the SAW leaving the transducers the primary function of transducing.

Such a structure may be a reflective array structure (RAST). Typically a RAST is a series of reflecting conducting strips or grooves arranged parallel to one another across a SAW track to reflect SAW from one track to another track where the SAW may again be reflected by another RAST into a transducer. By varying the spacing of the reflecting strips the RAST will reflect a wide band of frequencies, and by varying the length of reflecting strips the RAST will provide an amplitude weighting.

Using two RAST's both with varying reflecting strips separation a dispersive delay line, may be designed where the frequency increases, or decreases, with time within the pulse i.e. "chirp". Such devices are useful in pulse compression radars where a short pulse is expanded and the expanded pulse transmitted; the received pulse is compressed to form a short received pulse for comparison with the short initial pulse to determine e.g. range. It is necessary that the pulse expansion and compression devices are matched. Unfortunately when a high frequency SAW passes under a structure designed to reflect low frequency SAW mode conversion, i.e. SAW to bulk acoustic waves (BAW) can occur. This significantly depletes the SAW energy and can normally only be avoided by limiting the frequency range of SAW i.e. limiting the bandwidth of the device. Thus whilst a down chirp dispersive delay line (decreasing frequency with time) can easily be produced, up chirp dispersive delay lines (increasing frequency with time) is subject to the mode conversion limitations.

It would be useful to have a SAW device which allows frequency dispersion up and down chirp based on the RAST structure thereby allowing (i) design flexibility in choosing the various functions to be carried out by the transducers and structures between the transducers to give optimum performance, (ii) the advantage of a folded structure (reduction by a half in length of substrate), and (iii) the reduced sensitivity to imperfection in the processing (breaks in the reflections are relatively unimportant c.f. with finger breaks in transducers).

According to this invention a surface acoustic wave device comprises a substrate able to support surface acoustic waves, an input transducer for launching surface acoustic waves along a first track on the substrate, an output transducer for receiving surface acoustic waves from a second track on the substrate, and first and second reflective array structures arranged to reflect surface acoustic waves from the first track into the second track, the first and second reflective array structures each comprising numerous reflecting strips or grooves arranged parallel to one another in echalon across the first and second tracks respectively.

The substrate may be a piezoelectric material e.g. quartz or lithium niobate, or a non-piezoelectric material with piezo electric material deposited on the substrate under or over the two transducers.

The spacing between reflecting strips or grooves may be periodic or varying along the RAST. Also the length of such strips or grooves may be equal or varying along the RAST. The length of the RAST may lie along a straight or a curved path.

The transducers may be interdigital comb like transducers with equal length and spaced fingers or of varying finger length and or spacing. Also the transducers may be arranged with the fingers in echalon across the SAW tracks.

The invention will now be described by way of example only with reference to the accompanying drawings in which.

Figure 1:
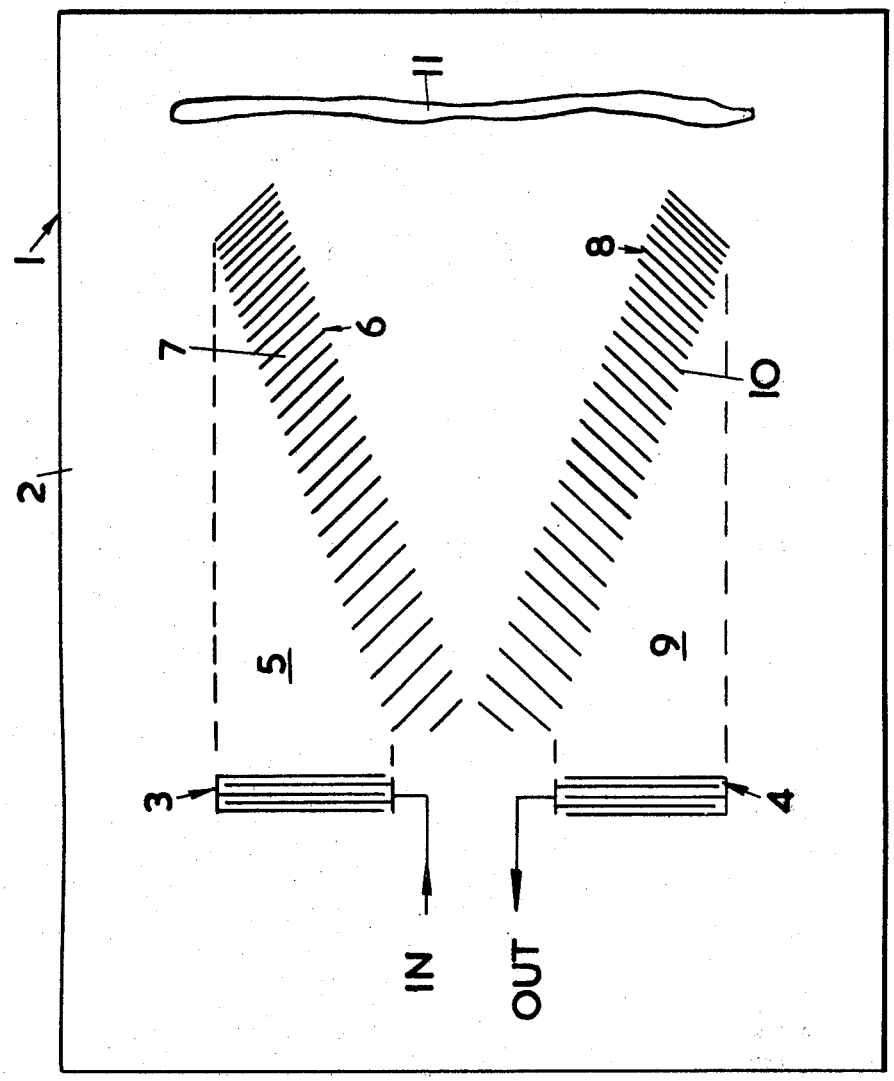
FIG. 1 shows diagrammatically a device for providing "up chirp" pulse expansion.

As shown in FIG. 1 a piezoelectric e.g. lithium niobate substrate 1 has a polished, flat, surface 2 along which SAW may travel. Deposited on the surface 2 are two broad band interdigital comb transducers namely an input transducer 3 and an output transducer 4 shown diagrammatically as having only a few finger pairs, typically it may have about 2 – 10 finger pairs. The input transducer 3 will launch SAW in a first track 5 across which a first RAST 6 is arranged. This first RAST 6 comprises numerous straight reflecting conducting strips 7 of equal length but gradually decreasing spacing arranged in echalon across the first track 5. Similarly a second RAST 8 is arranged in a second SAW track 9 across which the output transducer 4 is arranged. The second RAST 8 is similar in construction to the first RAST 6 and has numerous reflecting conducting strips 10. Typically a RAST may have 100 to 10,000 strips. The transducers 3, 4 and RAST's 6, 8 are formed of vapour deposited aluminium, shaped by conventional photolithographic techniques. Alternatively the RAST may have grooves etched into the substrate 1 instead of deposited strips. An absorber 11, is arranged to absorb any SAW that pass through the RAST.

In operation an electrical impulse is applied to the input transducer 3 which launches a short burst of SAW into the first track 5, such a burst contains a wide spectrum of frequencies. These SAW are reflected by the strips 7 in the first RAST 6 into the second RAST 8 where the SAW are again reflected into the second track 9 and received by the output transducer 4. Since the strips 7, 10 in the RAST 6, 8 nearer the transducers 3, 4 are wider spaced than those further away, lower frequencies will be reflected by the leading strips 7, 10 (i.e. those nearer the transducers), and higher frequencies reflected from the trailing strips 7, 10. As a result the SAW path length is shorter for lower frequencies than for higher frequencies and therefore the output transducer 4 receives the higher frequencies later than the lower frequencies.

Figure 3A:
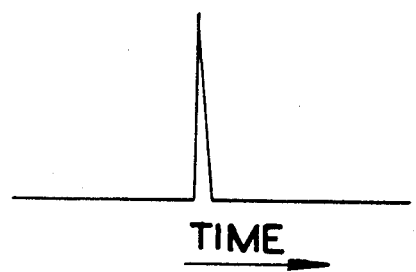
FIGS. 3a, 3b and 3c show the response of the device to a short input pulse, for "down" and "up chirp".
Figure 3C:
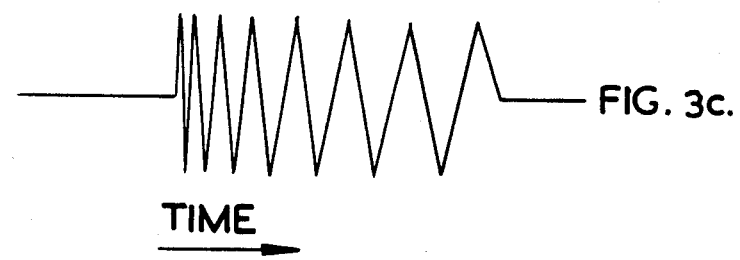
Figure 3B:
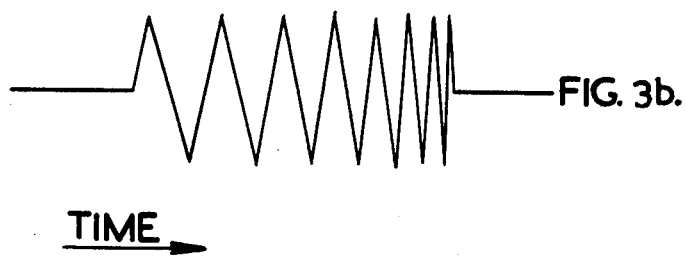

This is illustrated in FIG. 3 where FIG. 3A shows a typical input pulse, and the FIG. 3B shows a typical unweighted output from the output transducer. The lower frequencies are at the front end of the pulse and the higher frequencies at the rear end of the pulse. It is seen that the short input pulse is expanded many times by the device of FIG. 1; the expansion being determined by the difference in SAW path length of the higher and lower frequencies.

By arranging the spacing of the reflecting strips in the RAST so that the leading strips are spaced closer together than the trailing strips (i.e. the opposite of FIG. 1) than the response to an input pulse FIG. 3a would be as shown in FIG. 3C where the higher frequencies occur the front end of the output pulse. This provides pulse expansion with down chirp.

If the long down chirp pulse of FIG. 3c is applied to the device of FIG. 1 then the output will be of the form of the short pulse of FIG. 3A, i.e. a pulse has been compressed.

Thus by providing a matched pair of devices similar to FIG. 1 but with one device providing up chirp (e.g. FIG. 1) and the other down chirp a pulse can be expanded and transmitted as a radar pulse, then received and compressed for subsequent processing in a radar system.

Inclining the RAST across the SAW tracks, i.e. arranging the strips in echalon, high frequencies SAW do not travel under low frequencies reflecting strips and hence do not suffer the mode conversion referred to earlier. Thus permitting devices with larger fractional bandwidth (bandwidth divided by centre frequency) to be constructed.

When SAW pass through the RAST they travel slower than along the free surface of the substrate. As a result there are small refraction effects when SAW enter the RAST and when they leave the RAST. With a RAST inclined at 45° to the SAW track such refraction effects cancel but for other angles of RAST inclination compensation is required; this is arranged by a small additional inclination of the reflecting strips 7, 10 within a RAST.

Figure 2:
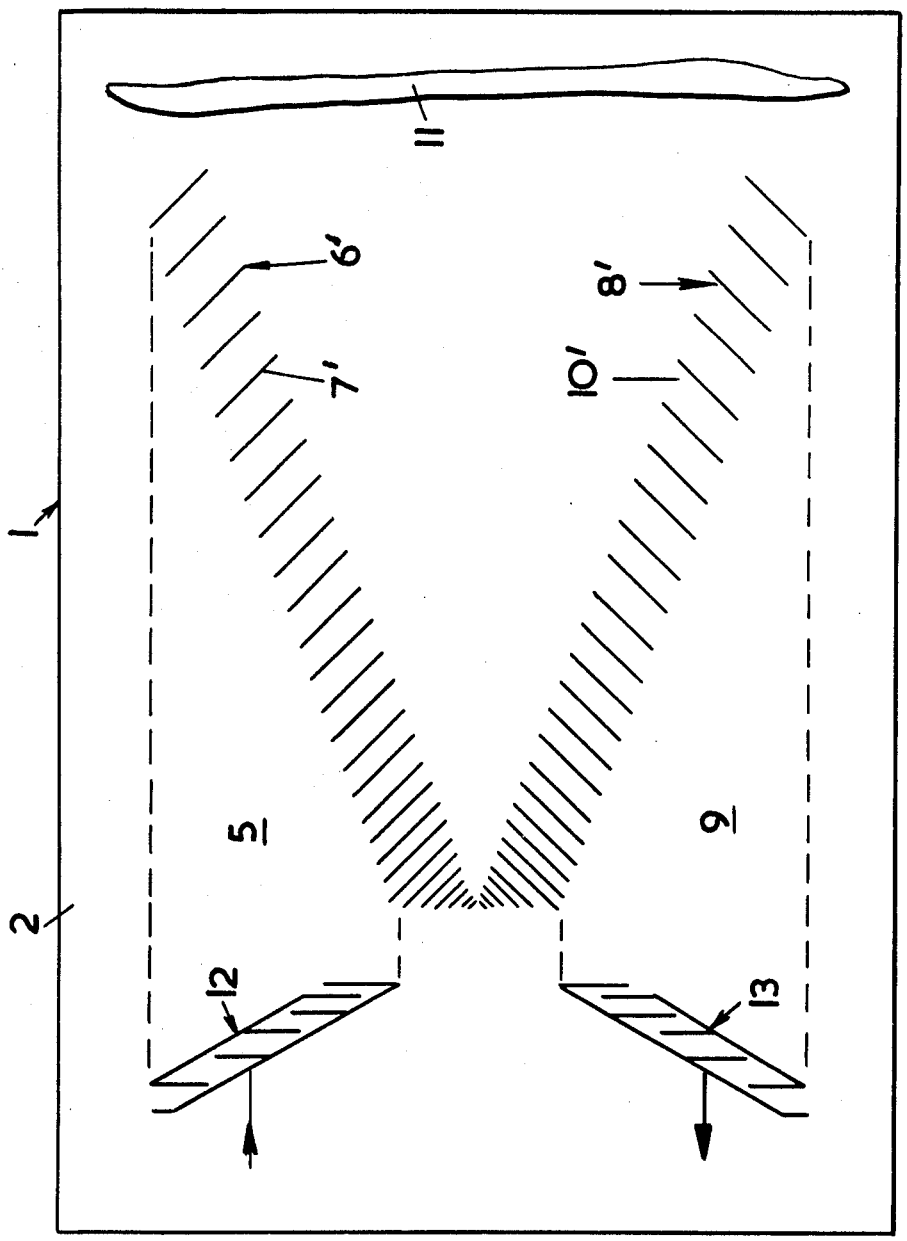
FIG. 2 is an alternative device to FIG. 1 shown for providing "downchirp"

FIG. 2 shows a pulse compression/expansion device having two RAST 6', 8' similar to those of FIG. 1 in two SAW tracks 5, 9, and indicated by the same reference numerals but arranged to provide down chirp by having the leading strips 7', 10' closer together than the trailing strips. Two transducers, an input transducer 12 and an output transducer 13, are arranged across the SAW tracks 5, 9 but inclined thereto. In addition the finger spacing in the transducers 12, 13 varies so that the fingers closest spaced are in a part of the SAW corresponding to similar spacing between strips 9', 10' in the RAST's 6', 8'.

The finger pairs launching the lower frequency SAW are at the end of the transducer remote from the finger pairs launching the higher frequency SAW. Since the transducers are inclined steeply there is little overlap of finger pairs launching different frequency SAW. By keeping the number of fingers, in a common line along the SAW track small, complicating interactive effects in the design of transducers are avoided. These effects easily occur on high coupling material such as lithium niobate, specially chosen for low loss.

When impulsed the input transducer 12 will launch SAW in the first track 5 with higher frequencies concentrated towards the bottom of the first track 5 (that part nearest the centre of the device) and lower frequencies at the top of the track 5. The output from the output transducer 13 will be of the form as shown in FIG. 3C.

Inclining the transducers 12, 13 permits an increase in fractional bandwidth over the device shown in FIG. 1. It also reduced the insertion loss through (i) design of transducer e.g. reduced finger resistance and (ii) ensuring that SAW of a given frequency are radiated primarily into that part of the RAST where they will be reflected, i.e. it is necessary in design to ensure that fingers in the transducer generating a given frequency are aligned with reflectors in the RAST capable of efficiently reflecting that frequency.

In a modification the lengths of the fingers in the transducers 3, 4, 12, 13, may be varied to provide amplitude weighting. Additionally or alternatively the length of strips in the RAST's may be varied. When different length strips are used additional reflecting strips may be incorporated into the RAST and angled to reflect some SAW into an absorber. The additional reflecting strips prevent refraction of SAW passing through the RAST as described in U.S. Pat. application No. 590,908, entitled Surface Acoustic Wave Devices, filed by the present inventor on June 27, 1975.

Each RAST 6, 8 of FIGS. 1, 2 is shown inclined across a SAW track 5, 9, and with the centre of each strip 7, 10, lying along a common straight line. In a modification the centre of each strip may lie along a curved line.

Correction of phase error, if any, may be achieved by deposition of a variable width metallic strip between the two RAST's.

If required the output transducer 4, or 13 could be arranged to the right of the second RAST 8 (as seen in FIGS. 1, 2). The strips 10 would be angled to reflect SAW into this new position and spaced apart so that higher frequencies from RAST 6 reflect into the higher frequency end of RAST 8. Thus SAW in the second track 9 would travel in the same direction as those in the first track. Such a device would not provide pulse expansion or compression but could provide a weighting or filtering of an input pulse.

In all the constructions noted above the roles of input and output transducer may be reversed.

I claim:

1. A surface acoustic wave device comprising a substrate able to support surface acoustic waves, an input transducer for launching surface acoustic waves along a first track on the substrate, an output transducer for receiving surface acoustic waves from a second track on the substrate, and first and second reflective array structures arranged to reflect surface acoustic waves from the first track into the second track, the first and second reflective array structures each comprising numerous reflecting elements arranged parallel to one another in echalon across the first and second tracks respectively.

2. A device as claimed in claim 1 wherein the spacing between the reflecting elements is periodic.

3. A device as claimed in claim 1 wherein the spacing between the reflecting elements varies along the arrays.

4. A device as claimed in claim 3 wherein the transducers have finger electrodes whose interspacing varies along the transducers to form dispersive transducers.

5. A device as claimed in claim 4 wherein the finger electrodes in each transducer are arranged in echalon across their respective tracks.

6. A device as claimed in claim 1 wherein the length of each reflecting element is equal.

7. A device as claimed in claim 1 wherein the length of each reflecting element varies along the length of the arrays.

8. A device as claimed in claim 1 wherein the transducers have finger electrodes which vary in length.

9. A device as claimed in claim 1 wherein the reflecting elements are strips.

10. A device as claimed in claim 1 wherein the reflecting elements are grooves.

11. A device as claimed in claim 1 wherein the length of the arrays lie along straight paths.

12. A device as claimed in claim 1 wherein the length of the arrays lie along curved paths.

13. A device as claimed in claim 1 wherein the substrate is quartz.

14. A device as claimed in claim 1 wherein the substrate is lithium niobate.

15. A device as claimed in claim 1 wherein the substrate is non-piezo electric and has piezoelectric regions at the transducers.

* * * * *

UNITED STATES PATENT AND TRADEMARK OFFICE
CERTIFICATE OF CORRECTION

PATENT NO. : 3,975,697
DATED : August 17, 1976
INVENTOR(S) : Edward George Sydney Paige It is certified that error appears in the above-identified patent and that said Letters Patent are hereby corrected as shown below:

Please correct the assignee to read:

-- the Secretary of State for Defence in Her Britannic Majesty's Government of the United Kingdom of Great Britain and Northern Ireland, London, England --

Signed and Sealed this

Twenty-fifth Day of January 1977

[SEAL]

Attest:

RUTH C. MASON
Attesting Officer

C. MARSHALL DANN
Commissioner of Patents and Trademarks